US012628563B2

(12) United States Patent
 Kämpfe

(10) Patent No.: US 12,628,563 B2
(45) Date of Patent: May 12, 2026

(54) PIEZOELECTRIC ELEMENT AND METHOD FOR PRODUCING A PIEZOELECTRIC ELEMENT

(71) Applicant: Fraunhofer-Gesellschaft zur Förderung der Angewandten Forschung E.V., Munich (DE)

(72) Inventor: Thomas Kämpfe, Dresden (DE)

(73) Assignee: Fraunhofer-Gesellschaft zur Förderung der Angewandten Forschung E.V., Munich (DE)

( * ) Notice: Subject to any disclaimer, the term of this patent is extended or adjusted under 35 U.S.C. 154(b) by 905 days.

(21) Appl. No.: 17/757,588

(22) PCT Filed: Dec. 18, 2020

(86) PCT No.: PCT/EP2020/087074
 § 371 (c)(1),
 (2) Date: Jun. 17, 2022

(87) PCT Pub. No.: WO2021/123205
 PCT Pub. Date: Jun. 24, 2021

(65) Prior Publication Data
 US 2023/0019457 A1    Jan. 19, 2023

(30) Foreign Application Priority Data

Dec. 19, 2019    (DE) ..................... 10 2019 220 132.6

(51) Int. Cl.
 H01L 41/18 (2006.01)
 H01L 41/047 (2006.01)
 (Continued)

(52) U.S. Cl.
 CPC ......... H10N 30/85 (2023.02); H10N 30/2047 (2023.02); H10N 30/302 (2023.02); H10N 30/708 (2024.05); H10N 30/87 (2023.02)

(58) Field of Classification Search
 CPC ...... H10N 30/85; H10N 30/87; H10N 30/302; H10N 30/708; H10N 30/2047
 (Continued)

(56) References Cited

U.S. PATENT DOCUMENTS 5,122,477 A * 6/1992 Wolters .................. H10D 1/692
                                                         257/E21.011
5,536,963 A   7/1996 Polla
 (Continued)

OTHER PUBLICATIONS

European Patent Office, International Search Report and Written Opinion in application No. PCT/EP2020/087074, dated Mar. 29, 2021, 12 pages, Rijswijk Netherlands.
 (Continued)

*Primary Examiner* — Emily P Pham
*Assistant Examiner* — Monica Mata
(74) *Attorney, Agent, or Firm* — Marshall & Melhorn, LLC

(57) ABSTRACT

A piezoelectric element and a method of manufacturing the piezoelectric element are provided. The piezoelectric element is provided with a substrate having an intermediate layer disposed between a first substrate layer and a second substrate layer, a first electrode layer of an electrically conductive non-ferroelectric material disposed on the second substrate layer, a ferroelectric, piezoelectric and/or flexoelectric layer disposed on the first electrode layer, and a second electrode layer of an electrically conductive non-ferroelectric material disposed on the ferroelectric, piezoelectric and/or flexoelectric layer. The intermediate layer and/or the first substrate layer is removed below a layer stack formed by the first electrode layer, the ferroelectric, piezoelectric and/or flexoelectric layer, and the second electrode layer so that the layer stack can be moved in a translatory manner along its normal directed along the layer sequence.

10 Claims, 16 Drawing Sheets

(51) Int. Cl.

| | |
|---|---|
| *H01L 41/08* | (2006.01) |
| *H01L 41/09* | (2006.01) |
| *H01L 41/113* | (2006.01) |
| *H10N 30/00* | (2023.01) |
| *H10N 30/20* | (2023.01) |
| *H10N 30/30* | (2023.01) |
| *H10N 30/85* | (2023.01) |
| *H10N 30/87* | (2023.01) |

(58) Field of Classification Search
USPC ........................................................ 310/311
See application file for complete search history.

(56)                     References Cited

U.S. PATENT DOCUMENTS

| | | | |
|---|---|---|---|
| 9,290,376 | B1 | 3/2016 | Cheng et al. |
| 2013/0140156 | A1 | 6/2013 | Fujii et al. |
| 2013/0250007 | A1 | 9/2013 | Ishimori et al. |

OTHER PUBLICATIONS

German Patent and Trademark Office, German Examination Report in application No. 10 2019 220 132.6 dated Jun. 18, 2020, 9 pages, Munchen, Germany.
Saya et al., Fabrication and characterization of mechanical resonators integrating microcontact printed PZT films, 2017 Joint IEEE International Symposium on the Applications of Ferroelectric (ISAF) / International Workshop on Acoustic Transduction Materials and Devices (IWATMD) / Piezoresponse Force Microscopy (PFM), IEEE May 7, 2017, pp. 89-92.

* cited by examiner

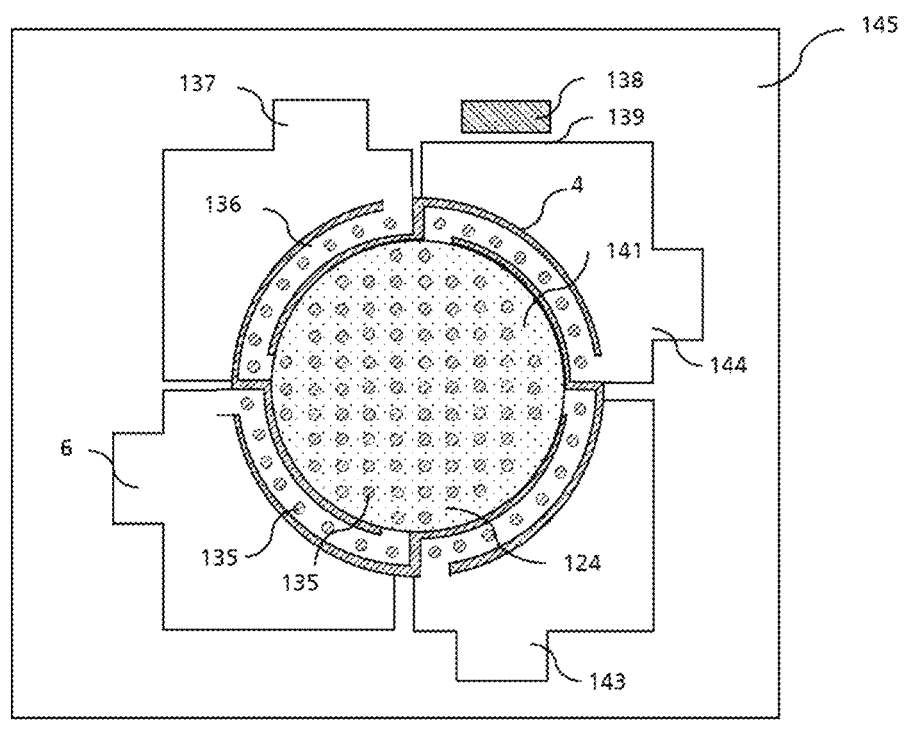
Fig. 23
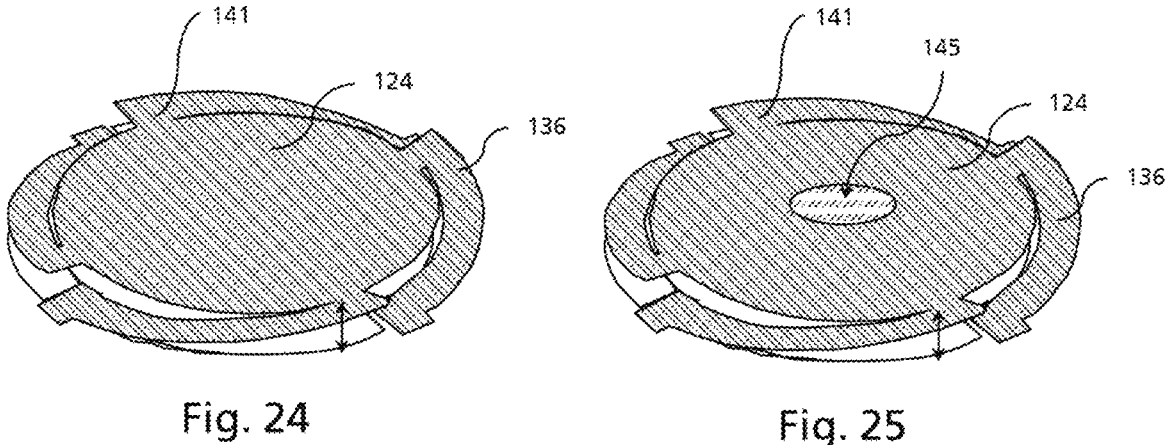
Fig. 24                    Fig. 25

PIEZOELECTRIC ELEMENT AND METHOD FOR PRODUCING A PIEZOELECTRIC ELEMENT

FIELD

The present invention relates to a piezoelectric element and a method of manufacturing a piezoelectric element.

BACKGROUND

So far, piezoelectric components such as ultrasonic transducers as well as RF (radio frequency) switches or Fabry-Pérot interferometers cannot be easily integrated into a CMOS (complementary metal-oxide-semiconductor) process and therefore require complex and expensive integrated circuit packaging. In particular, the piezoelectric materials commonly used for this purpose such as lead zirconate titanate (PZT) are not CMOS compatible (complementary metal-oxide-semiconductor) and furthermore not RHoS compatible (Restriction of Hazardous Substances, EU Directive 2011/65/EU). Therefore, aluminum nitride (AlN) or scandium-doped AlN has often been used for such components up to now. This material has, on the one hand, a low piezoelectric coefficient and, on the other hand, strong polymorphism, which causes the material to be frequently grown in the non-piezoelectric crystal phase.

Typical applications of piezoelectric ultrasonic transducers are in the field of ultrasonic sensor technology and fingerprint sensors, but several problems arise here, such as a limited area filling as well as limitations with regard to a diaphragm thickness and diaphragm size, which also limit the usable frequencies and measurement resolution. This is in particular a hindrance for high-frequency switch systems. In addition, the electrical control voltages used are often comparatively high, so that applications in the field of "Internet of Things (IoT)" or in applications with direct physical contact are problematic.

SUMMARY

The present invention is therefore based on the object of proposing a piezoelectric element and a method for its manufacture which avoids the abovementioned disadvantages, i.e. which enable the simple manufacture of a piezoelectric element which operates reliably and can be used in a wide range of applications.

According to the invention, this object is achieved by a piezoelectric element and by a method according to the claims. Advantageous embodiments and further developments are described in the dependent claims.

A piezoelectric element has a substrate with an intermediate layer disposed between a first substrate layer and a second substrate layer. A first electrode layer of an electrically conductive, non-ferroelectric material is applied to the second substrate layer. A second electrode layer is disposed on the ferroelectric, piezoelectric and/or flexoelectric layer, which is formed from an electrically conductive, non-ferroelectric material. The intermediate layer and/or the first substrate layer is or are removed below a layer stack. The layer stack is formed by the first electrode layer, the ferroelectric, piezoelectric and/or flexoelectric layer and the second electrode layer. The layer stack can be moved in a translatory manner along its normal directed along the layer sequence.

By structuring the substrate in such a way that the layer stack together with the region of the second substrate layer connected thereto can be moved in a translatory manner, i.e. in particular can oscillate, a system capable of oscillating is realized which, in addition, can be controlled or regulated in its movement via the electrode layers and the ferroelectric, piezoelectric and/or flexoelectric layer by applying and changing an electrical voltage. The layer stack is typically only connected at one end to the other regions of the respective layers. Moreover, since the intermediate layer or the first substrate layer is removed, i.e. the second substrate layer is physically spaced from the first substrate layer by a free space in the region of the layer stack, a diverse vibration behavior can be realized at comparatively low electrical control voltages.

The first electrode layer and the second electrode layer can here be formed from a material that is the same or identical, but different materials can also be used for these layers. Typically, the first electrode layer or the second electrode layer is formed of titanium nitride (TiN), tantalum nitride (TaN), ruthenium (Ru), ruthenium oxide (RuO) or platinum. Atomic layer deposition and/or physical vapor deposition can be used.

The substrate can be designed as a so-called "silicon-on-insulator" (SOI) wafer, i.e. the first substrate layer and the second substrate layer are separated from each other by an electrically insulating layer. The electrically insulating layer is thus arranged between the two substrate layers and is in direct contact, that is in proximate touching contact, with each of the layers. Any material with an electrical conductivity of less than $10^{-8}$ S/m is to be considered electrically insulating. The intermediate layer can, however, also be formed from a dielectric material. Heavily doped silicon that has a sufficiently high electric conductivity and can simultaneously have a good structure can be used as the substrate.

Provision can be made that the second substrate layer has a smaller layer thickness than the first substrate layer to ensure the mechanical stability as desired.

The ferroelectric, piezoelectric, and/or flexoelectric layer has a layer thickness of at most 500 nm. At these thicknesses, a change in the polarization state of the ferroelectric is already achieved at small electrical voltages below 5 V and preferably below 3 V. A required control voltage is thus considerably smaller than with known low voltage solutions and a use for low power applications is possible.

The intermediate layer may be removed below a web formed from the second substrate layer, such that the web can be moved in a translatory manner parallel to the layer stack. The web and layer stack can thus be spaced apart, increasing the variability of the element. The web is usually clamped on two sides, i.e. in a material bond at the ends of its longitudinal axis with the remaining second substrate layer. The layer stack arranged on the structured second substrate layer can be clamped on one side or likewise on two sides, i.e. have a fixed bearing. Preferably, the intermediate layer is removed only below the web, so it can still remain in other places. The first substrate layer and the second substrate layer are preferably always spaced apart from each other by the intermediate layer, i.e. are never in direct contact with each other.

The ferroelectric, piezoelectric and/or flexoelectric layer may have undoped hafnium oxide (HfO2) or zirconium oxide (ZrO$_2$) or doped hafnium oxide as the ferroelectric, piezoelectric and/or flexoelectric material, the doped hafnium oxide preferably being doped with silicon, aluminum, germanium, magnesium, calcium, strontium, barium, titanium, zirconium and/or a rare earth element, i.e. scandium, lanthanum, cerium, praseodymium, neodymium, promethium, samarium, europium, yttrium, gadolinium, terbium, dysprosium, holmium, erbium, thulium, ytterbium, lutetium. Various electric properties can thus be set as desired. Said elements and materials are suitable for a compliant formation of layers.

This material presents many positive properties for use in both CMOS and MEMS processes as well as piezoelectric systems. It is CMOS compatible, can be integrated into the so-called BEoL ("Back-end-of-Line"), is hysteresis-free, is RHoS compatible, insensitive to electromagnetic fields as well as high-energy radiation and shows no aging effects.

It may also be provided that the ferroelectric, piezoelectric and/or flexoelectric layer comprises at least one ultralaminate of a layer of hafnium oxide and a layer of another oxide. To increase a breakdown strength, it can therefore be provided that the ferroelectric intermediate layer is multilayered and comprises at least one layer of an oxide layer with a thickness of less than 3 nm and a hafnium oxide layer or zirconium oxide layer with a thickness between 3 nm and 20 nm. This configuration also increases the switching voltage, for example by a factor of 5, in addition to the breakdown voltage. An alternating series control of the ferroelectric capacitors can additionally be carried out for high voltage applications. It is thus possible due to the CMOS compatibility of the hafnium oxide or of the zirconium oxide and of said dopants to produce further electronics on the same substrate, that is an on-chip production. The described element can be produced as a single miniaturized SMD component (surface mounted device), allowing for even very small designs such as the 01005 format. The oxide layer can be formed as an aluminum oxide layer ($Al_2O_3$), a silicon oxide layer ($SiO_2$), and/or a zirconium oxide layer ($ZrO_2$).

Typically, at least one applied layer, but preferably each of the applied layers, that is the first electrode layer, the ferroelectric, piezoelectric, and/or flexoelectric intermediate layer and the second electrode layer are formed as a compliant layer that covers the layer disposed thereunder with which they are in proximate, that is direct, contact without cutouts or holes.

An ultrasonic transducer, fingerprint sensor, RF switch or radio frequency switch, optical interferometer or spectrometer, infrared spectrometer or infrared spectrometer according to the invention has a piezoelectric element with the previously described properties. In the context of this document, the term "high frequency" is to be understood as a frequency range of the electromagnetic spectrum starting at 9 kHz.

In a method of manufacturing a piezoelectric element, a first electrode layer of an electrically conductive, non-ferroelectric material is deposited on a substrate in which an intermediate layer is disposed between a first substrate layer and a second substrate layer. A ferroelectric, piezoelectric and/or flexoelectric layer is deposited on the first electrode layer and a second electrode layer of an electrically conductive, non-ferroelectric material is deposited on top of it. The intermediate layer and/or the first substrate layer are removed below a layer stack formed by the first electrode layer, the ferroelectric, piezoelectric and/or flexoelectric layer and the second electrode layer so that the layer stack can be moved in a translatory manner along its normal directed along the layer sequence.

The second substrate layer may be perforated prior to removal of the intermediate layer and/or the first substrate layer to provide the largest possible area of vibratable elements.

It may be provided to deposit the ferroelectric, piezoelectric and/or flexoelectric layer by means of atomic layer deposition, in particular by means of atomic layer deposition with alternating deposition cycles of a dielectric material and a dopant.

The described device is typically carried out with the described method, i.e. the described method is designed for manufacturing the described device.

DESCRIPTION OF THE FIGURES

Exemplary embodiments of the invention are shown in the drawings and will be explained in the following with reference to FIGS. 1 to 29.

Shown are:

FIG. 23 a view corresponding to FIG. 20 with several connection pads and a centrally arranged diaphragm;

FIG. 24 a perspective view of the diaphragm of FIG. 23;

FIG. 25 a view of a perforated diaphragm corresponding to FIG. 24;

DETAILED DESCRIPTION

Figure 1:
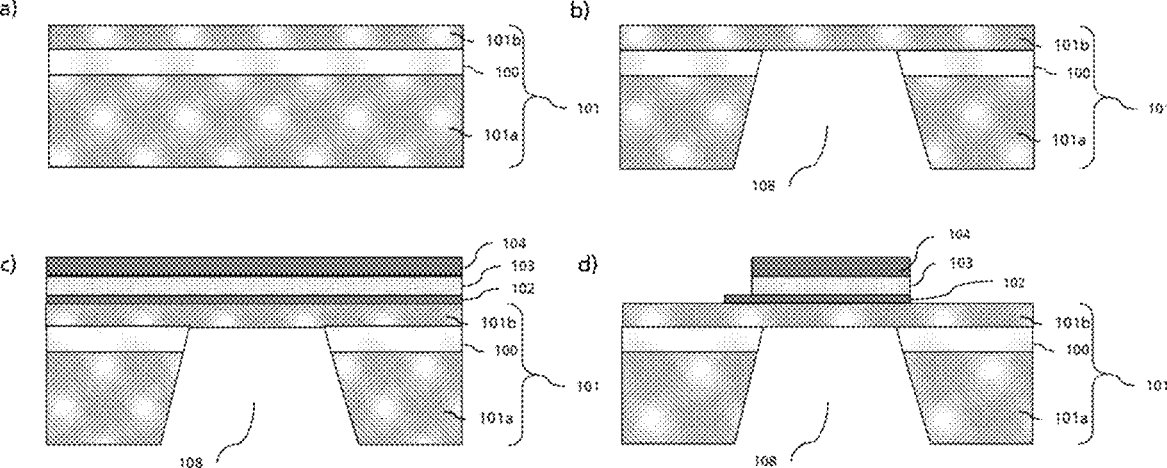
FIG. 1 a schematic representation of a method for manufacturing a piezoelectric element in a cross-sectional view.

FIG. 1 shows a method of producing a piezoelectric element in a schematic view FIG. 1a) shows a cross-sectional view of a substrate 101 in which an intermediate layer 100 is arranged between a first semiconductor layer as a first substrate layer 101a and a second semiconductor layer as a second substrate layer 101b. In this case, the second semiconductor layer 101b has a smaller layer thickness than the first semiconductor layer 101a. The substrate 101 is a "silicon-on-insulator" wafer, i.e., the first semiconductor layer 101a and the second semiconductor layer 101b are made of highly doped silicon while the intermediate layer 100 in this embodiment example is made of an electrically insulating material, typically SiO$_2$.

As shown in FIG. 1b), in the following process step, the substrate 101 is structured as a diaphragm by performing a rear side etching of the first semiconductor layer 101a up to the intermediate layer 100 or buried oxide (BOX). Finally, as shown in FIG. 1b), a further structuring step of the intermediate layer 100 may be provided. In this case, the intermediate layer 100 is applied to completely cover the first substrate layer 101a in FIG. 1a), but in the step shown in FIG. 1b) it is removed only in a single region and remains at the edges.

On the second semiconductor layer 101b of the substrate 101, a first electrode layer 102 is conformally deposited as a back electrode, as shown in FIG. 1c). This first electrode layer 102 is formed of titanium nitride and was deposited by atomic layer deposition. Alternatively, other metals can be used as electrode materials, for example ruthenium, platinum, tungsten.

A ferroelectric, piezoelectric or flexoelectric layer 103 of hafnium oxide or zirconium oxide is deposited on the first electrode layer 102, for which atomic layer deposition was also used. The ferroelectric, piezoelectric or flexoelectric layer 103 is, in turn, formed as a compliant layer. In further embodiments, an alternating atomic layer deposition of hafnium oxide and a respective dopant or an alternating atomic layer deposition of hafnium oxide and a respective dopant and alternatingly a further oxide, for example Al$_2$O$_3$, may be provided.

A second electrode layer 104 is in turn deposited as a compliant layer on the ferroelectric, piezoelectric or flexoelectric layer 103 using physical vapor deposition. Instead of physical vapor deposition, atomic layer deposition or chemical vapor deposition can alternatively be used.

All layers are in direct, i.e. immediate, contact with the respective adjacent layers and completely cover these layers, as shown in FIG. 1c).

The structure shown in FIG. 1d) is obtained by applying a mask and structuring accordingly. This can be done using known etching processes, for example, wet chemical etching, ion etching, or reactive ion etching. Here, a layer stack formed of the first electrode layer 102, the ferroelectric, piezoelectric or flexoelectric layer 103 and the second electrode layer 104 is obtained, but now the metal-ferroelectric-metal layer stack is disposed thereon. The intermediate layer 100 is arranged such that the layer stack of first electrode layer 102, ferroelectric, piezoelectric or flexoelectric layer 103 and second electrode layer 104 is aligned or, as in FIG. 1d), nearly aligned with a recess 108 formed as a blind hole or trench, which serves as a perforation of the substrate 101. The second semiconductor layer 101b of the substrate 101 thus supports the layer stack, which can be moved in a translatory manner along its normal, which is oriented parallel to the layer sequence. By aligning the layer stack on a movable part of the second semiconductor layer 101b of the substrate 101, a system capable of oscillation is realized. Since side surfaces of this system are not in contact with surfaces of adjacent layers, a high degree of mobility is realized. Here, a side surface is to be understood as any surface of the layer stack and the exposed portion of the second semiconductor layer 101b of the substrate 101 that is angled with respect to a surface facing towards or away from the first semiconductor layer 101a of the substrate 101. Below the layer stack, both the first substrate layer 101a and the intermediate layer 100 are removed in the illustrated embodiment, but said layers remain laterally therefrom in regions not disposed below the layer stack.

The described method can be well integrated in the CMOS process flow of a high-k metal gate process flow by essentially depositing a ferroelectric, piezoelectric or flexo-electric capacitor on a diaphragm (namely the substrate 101) and thus realizing the piezoelectric properties. Piezoelectric expansion or shrinkage in the diaphragm plane upon application of an electrical voltage to the first electrode layer 102 and the second electrode layer 104 by an electrical voltage source results in bending of the diaphragm. Unlike in electrostatic systems, this direction of movement is implemented in both mechanical strain directions. This results in several potential applications: High-frequency excitation releases a sound wave or ultrasonic wave that can be used for medical applications, for example. In addition, feedback of the backscattered sound is possible via a measurement of the phase and frequency of the vibrating element. A fingerprint can be measured via a mechanical imprint of the piezoelectric element, which can also be called a pMUT (Piezoelectric Micromachined Ultrasonic Transducer) cell. This typically occurs in a higher frequency spectrum.

In the illustrated embodiment, a thin film ferroelectric 103 with a thickness below 100 nm is used. Thus, changes in the mechanical bracing already occur at low electrical voltages and the required control voltage is thus significantly lower than in already known low-voltage solutions, typically below 10V. This is particularly useful for low-power solutions.

Figure 2:
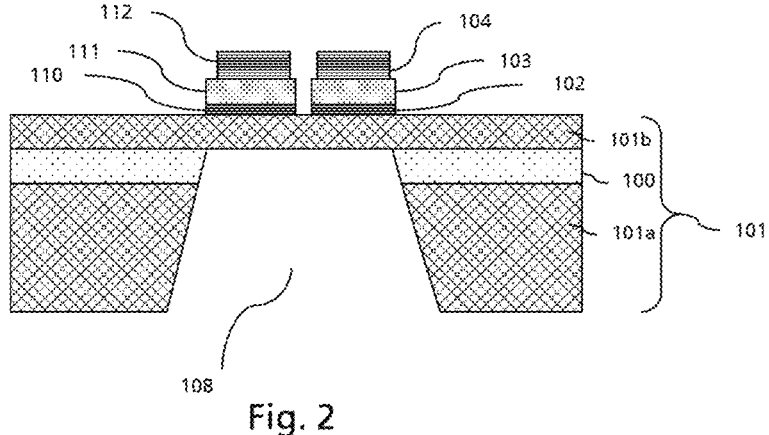
FIG. 2 a representation corresponding to FIG. 1 of a cross-section of another piezoelectric element.

FIG. 2 shows a further example of a piezoelectric element in a view corresponding to FIG. 1. Recurring elements are provided with identical reference numerals in this Figure and also in the following figures. Deviating from the processing step in FIG. 1d), in FIG. 2 the layer stack of the first electrode layer 102, ferroelectric, piezoelectric or flexoelectric layer 103 as well as second electrode layer 104 is structured above the blind hole as a recess 108 in such a way that first one recess or several recesses extending to the surface of the second semiconductor layer 101b of the substrate 101 are formed. This can be done with the already described known etching processes, for example wet chemical etching, ion etching or reactive ion etching, using an appropriate mask. This results in separate layer stacks with the corresponding individual layers lower (or first) electrode layer 102 or 110, ferroelectric, piezoelectric or flexoelectric layer 103 or 111, and upper (or second) electrode layer 104 or 112.

Figure 3:
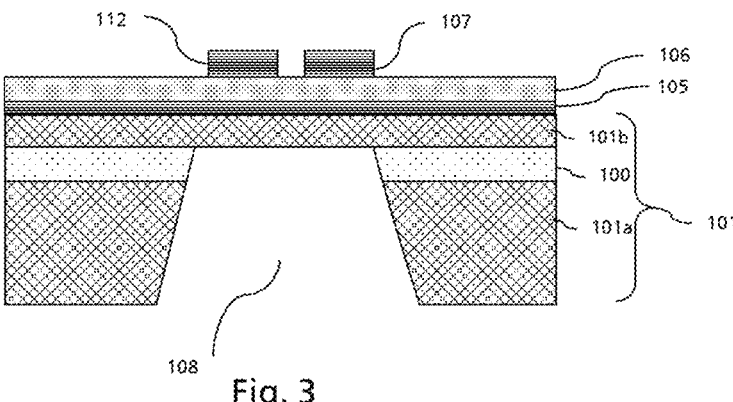
FIG. 3 a representation corresponding to FIG. 1 of a cross-section of another piezoelectric element with spatially separated electrodes.

FIG. 3 shows a further example of a piezoelectric element in a view corresponding to FIG. 1. In contrast to the processing step in FIG. 1*d*), in FIG. 3 the layer stack of the first electrode layer 102, ferroelectric, piezoelectric or flexoelectric layer 103 and second electrode layer 104 is structured above the blind hole 108 in such a way that initially one or more recesses are formed which extend to the surface of the ferroelectric, piezoelectric or flexoelectric layer 103. This, in turn, can be done with the known etching processes, for example, wet chemical etching, ion etching or reactive ion etching, using an appropriate mask. This results in separated layers of the upper electrode layer 104 as well as 112.

Figures 4, 5, 6, 7:
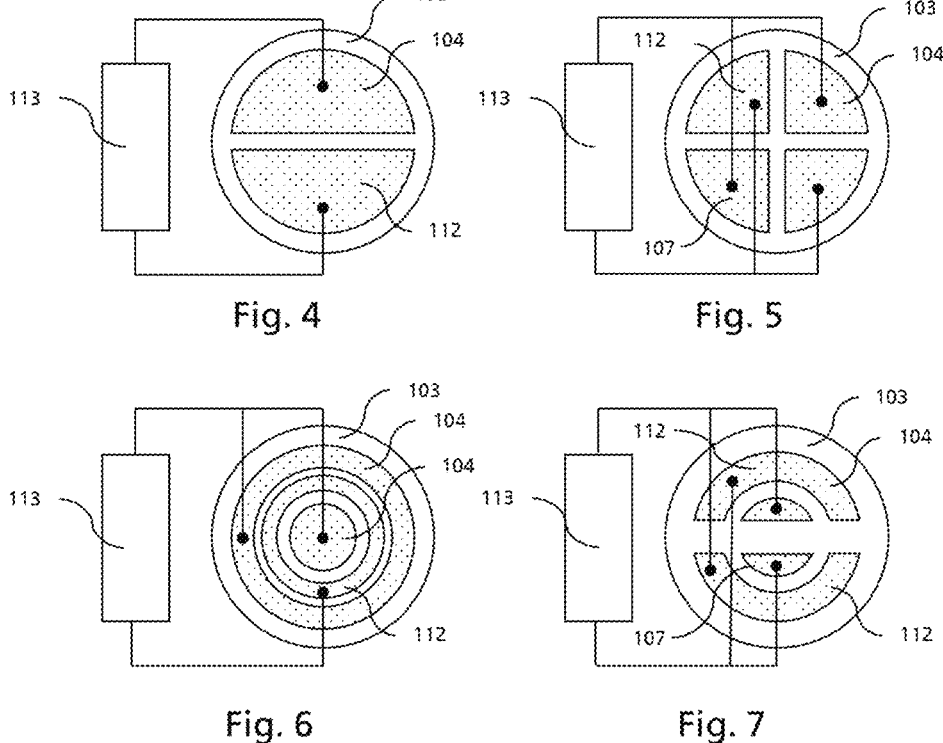
FIG. 4 a top view of the piezoelectric element.
FIG. 5 a representation corresponding to FIG. 4 of a piezoelectric element with four electrodes.
FIG. 6 a representation corresponding to FIG. 4 of a piezoelectric element with three concentrically arranged electrodes.
FIG. 7 a top view corresponding to FIG. 4 of a piezoelectric element corresponding to FIG. 3 and a further contact.

FIG. 4 shows a top view of a piezoelectric component corresponding to the cross-sectional views in FIGS. 1, 2 and 3, as well as its contacting. For this purpose, contacts are attached to the electrode layers 102, 104 and 112, if the depicted component is a piezoelectric component according to FIGS. 2 and 3. An electrical contact is given to the upper electrode layers 104 as well as 112 and the lower electrode layer 102 with an electrical drive by a actuation system 113 in the form of a control unit or control-regulation unit. The actuation system 113 excites the piezoelectric component to deflect by means of electrical signals. Typically, high frequency electrical actuation is used for this purpose so that resonant deflection of the diaphragm across the recess 108 can be achieved. In this regard, the actuation system 113 can be any electronic system that can excite the diaphragm. In addition, this actuation system 113 should make it possible to record a phase or frequency change of the diaphragm. FIGS. 5 to 7 show further top views of a piezoelectric component corresponding to FIGS. 2 and 3 with further arrangements of the upper electrodes 103 and 104.

Figure 8:
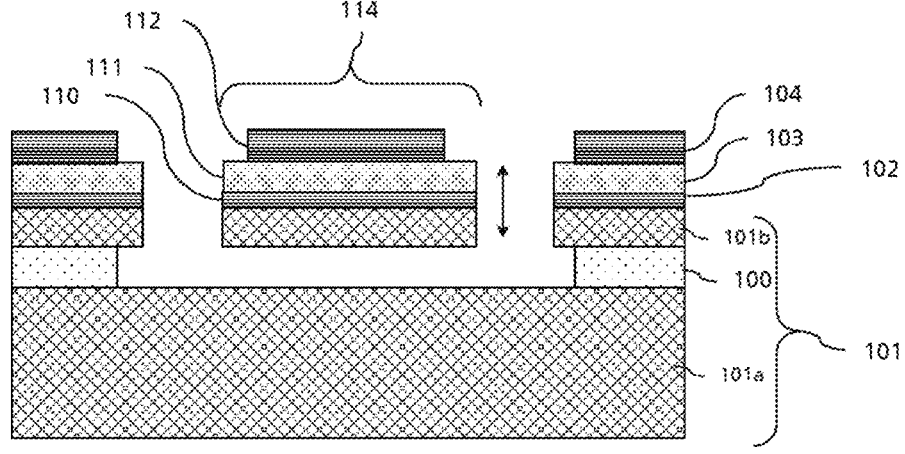
FIG. 8 a side view corresponding to FIG. 1 of a piezoelectric element with translationally movable web.

FIG. 8 shows a further example of a piezoelectric element in a view corresponding to FIGS. 1 and 2. In contrast to the processing steps in FIG. 1*b*), a first electrode layer 102, a ferroelectric, piezoelectric or flexoelectric layer 103 and second electrode layer 104 are deposited on the substrate 101 with the electrically insulating intermediate layer 100 in this embodiment. The deposition processes described in connection with FIG. 1 can be used for this purpose. This layer stack 102, 103, and 104 is now structured such that one or more recesses extending to the surface of the second semiconductor layer 101*b* of the substrate 101 are first formed. This can be done with the known etching processes, for example wet chemical etching, ion etching or reactive ion etching, using an appropriate mask. This results in separate layer stacks with the corresponding individual layers first, in this case lower electrode layer 102 or 110, ferroelectric layer 103 or 111, and upper electrode layer 104 or 112. Subsequently, the second semiconductor layer 101*b* of the substrate 101 and the intermediate layer 100 can also be structured accordingly so that the recesses extend to the surface of the first semiconductor layer 101*a* of the substrate 101. Now, by also still removing the portion of the intermediate layer 100 located below the layer stack and below the portion of the second semiconductor layer 101*b* of the substrate 101 on which the layer stack is seated, a web 114 or a beam is formed which is clamped on one side or even on both sides but can be moved in a translatory manner. The layers 110, 111 and 112 are arranged on the web 114. Even though the first semiconductor layer 101*a* is still located below the web 114, the intermediate layer 100 that originally completely covered the first semiconductor layer 101*a* is removed immediately below the web 114 but is still located on the first semiconductor layer 101*a* adjacent to the web 114.

Figure 9:
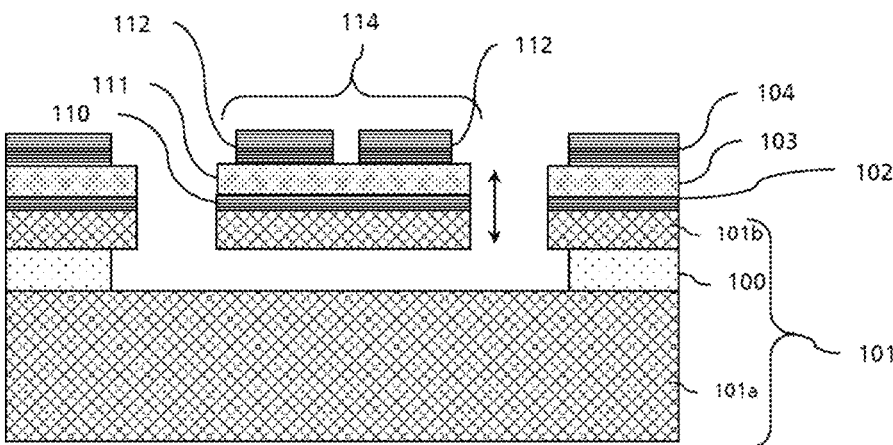
FIG. 9 a view corresponding to FIG. 8 of a piezoelectric element with spatially separated electrodes on the web.

In FIG. 9, a view corresponding to FIG. 8 shows another embodiment of a piezoelectric element. In contrast to the piezoelectric component shown in FIG. 8, the second electrode layer 112 arranged on the web 114 is separated into two spatially separate layers. This allows electrical contacting of the now separated upper electrode layers 104 and 112 with an actuation system 113 as shown in FIGS. 4-7.

Figure 10:
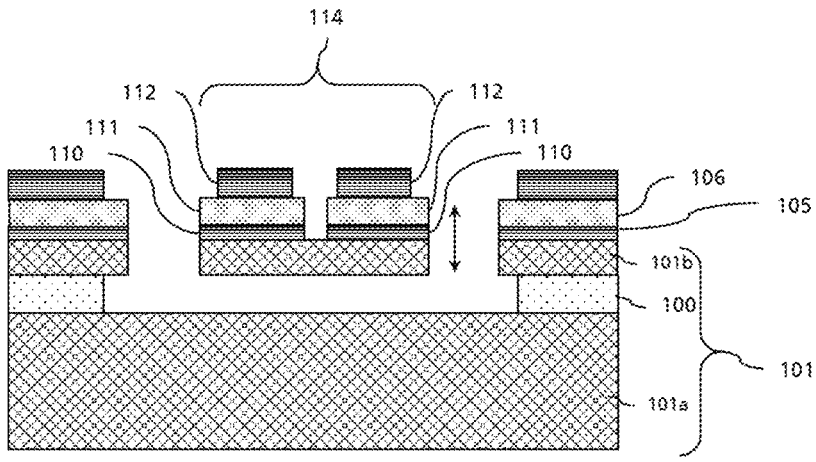
FIG. 10 a view corresponding to FIG. 8 of a piezoelectric element with spatially separated electrode stacks on the web.

In FIG. 10, a view corresponding to FIG. 8 shows another embodiment of a piezoelectric element. In contrast to the piezoelectric component shown in FIG. 8, the layer stack consisting of the first or lower electrode 105 or 110, the ferroelectric layer 103 or 111 and the second or upper electrode layer 107 or 112 is separated above the web 114 or a beam, resulting in two identically constructed layer stacks of the same height. This allows electrical contacting of the upper electrode layers 107 and 112 and the underlying layers 110 and 111 with a actuation system 113 as shown in FIGS. 4-7. Thus, two layer stacks are arranged on the web 114, each having a first electrode layer 105 or 110, a ferroelectric layer 103 or 111, and a second electrode layer 107 or 112.

Figure 11:
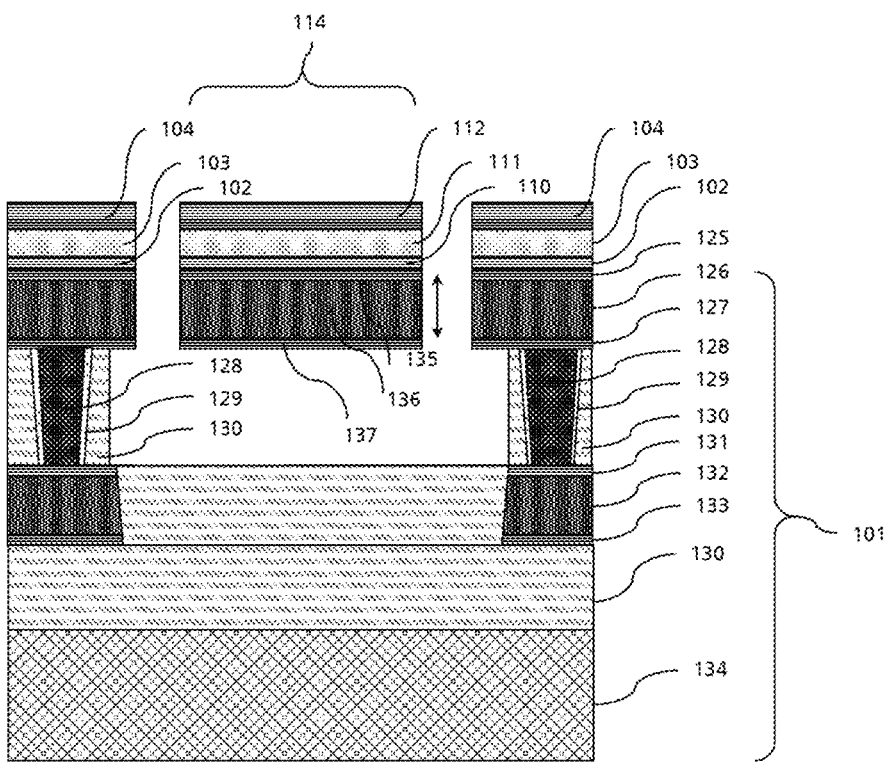
FIG. 11 a view corresponding to FIG. 8 of a piezoelectric element with electrode stacks arranged on the web.

FIG. 11 shows a further example of a piezoelectric element in a view corresponding to FIGS. 1 and 8. Deviating from the processing steps in FIG. 1*b*), the substrate 101 now no longer has the second semiconductor layer 101*b* as the uppermost layer, but on a silicon wafer 134 any number of wiring levels of metallization layers as well as vias 128, an already structured metallization layer system 131, 132, 133, typically of TiN, aluminum with TiN or copper, cobalt, an intermediate dielectric layer as intermediate layer 130, vias 128 as well as barrier layers 129 and a second metallization layer system typically of the individual layers 125, 126, 127 corresponding to 131, 132, 133.

Barrier layers used for the metallization layers 125, 127, 131, and 133. Metallization layers without these layers are possible. The intermediate dielectric layer, also referred to as the "interlayer dielectric," is shown only schematically, as is the substrate 101 with wiring planes 130. In reality, the substrate 101 may have multiple such metallization layers and intermediate dielectric layers, as well as "front end of line" (FEoL) inserted transistors and their wiring. The first electrode layer 102 is deposited as a compliant layer on the metallization layer 125. The ferroelectric layer 103 and the second electrode layer 104 are deposited subsequently. In this case, the electrode layer 102 can also be dispensed with, provided that the roughness of the layer 125 is low. A plurality of recesses is introduced into the layer stack 102, 103, 104 by means of etching processes described in FIGS. 1 and 8, in each of which the second metallization layer 125 first forms a floor. Subsequently, the second metallization layer 125, 126, 127 and subsequently, similarly as shown in FIG. 3*d*), also the intermediate dielectric layer 130 are structured and a part of this layer is removed, so that a web 114 is formed from the then structured second metallization layer 135, 136, 137 as the second substrate layer, the first structured electrode layer 110, the structured ferroelectric layer 111 and the second structured electrode layer 112. The web 114 is laterally spaced from other portions of the respective layers and clamped along its longitudinal axis at intermediate ends.

A dry etching process, e.g. HF (high frequency) steam process, can be used to remove the intermediate dielectric layer. The described process is performed in the "Back End of Line" (BEoL) to produce an ultrasonic transducer. An electrical contact to the structured first, i.e. lower, electrode layer 110 is established by means of a via electrode 128 in the non-etched and thus rigid region. The first electrode layer 112 as the second, i.e. upper, electrode layer is contacted, for example, by means of a further BEoL metallization, e.g. by means of a via electrode on the upper electrode 104.

Figure 12:
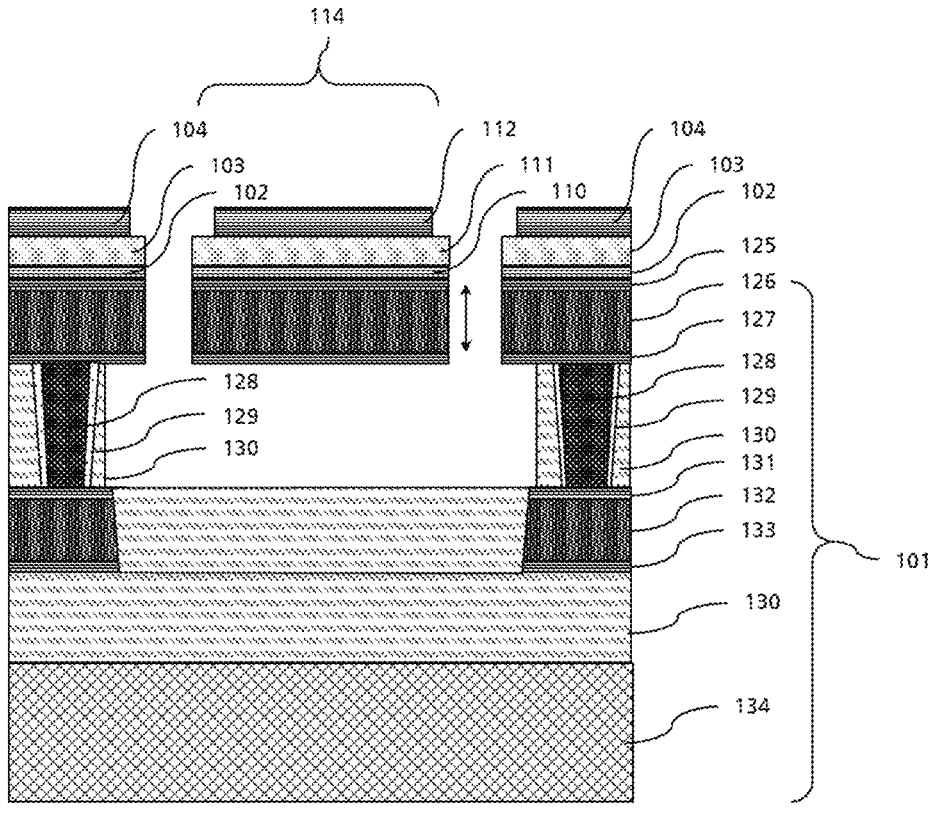
FIG. 12 a view corresponding to FIG. 11 of the piezoelectric element with electrode stacks arranged on the web and subsequently structured.

Another embodiment of a piezoelectric element is shown in FIG. 12 in a view corresponding to FIG. 11. Here, the second, i.e. upper, electrode layers 104 and 112 have been pulled back somewhat with respect to recesses made in the metallization layers 125, 126 and 127, so that the electrode layers 104 and 112 are now no longer flush with the respective underlying layer 103 or 111. This can reduce the amount of leakage current through the ferroelectric layer 106 or 111.

Figure 13:
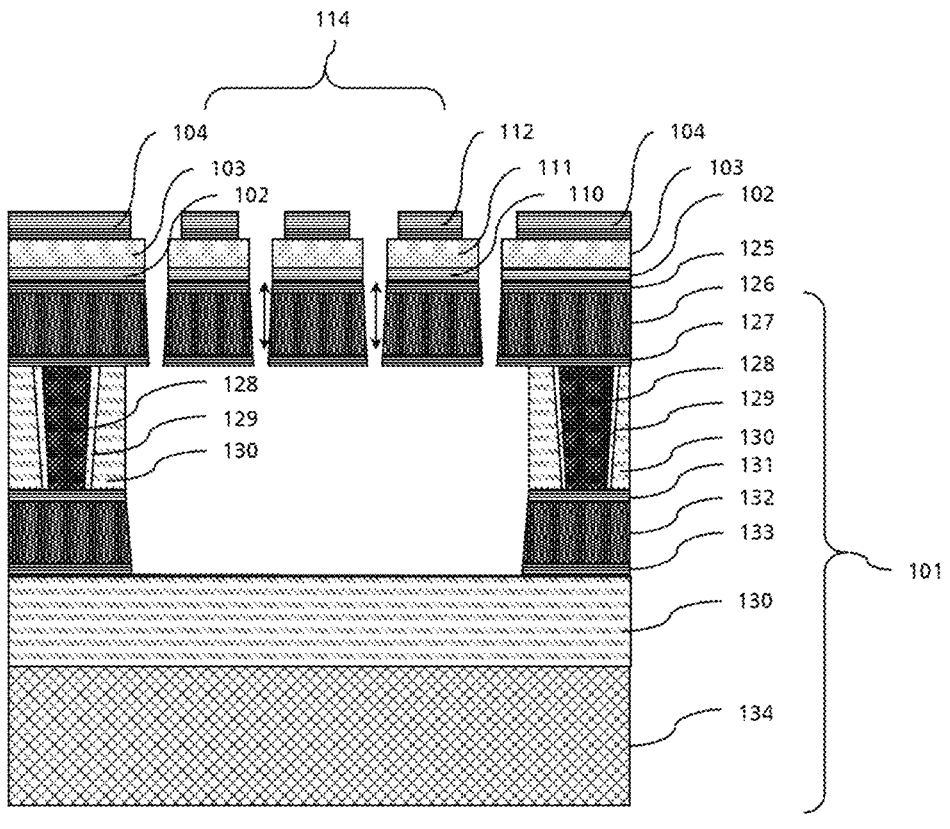
FIG. 13 a view corresponding to FIG. 11 of a piezoelectric element with multiple electrode stacks arranged on multiple webs.

FIG. 13 shows a further example of a piezoelectric element in a view corresponding to FIG. 11. Here, further perforations are introduced in the structuring process of the metallization layer 125, 126, 127 and the layer stack consisting of the first electrode layer 102, the ferroelectric layer 103 and the top electrode layer 104. These can facilitate the removal of the intermediate dielectric layer 130.

Figure 14:
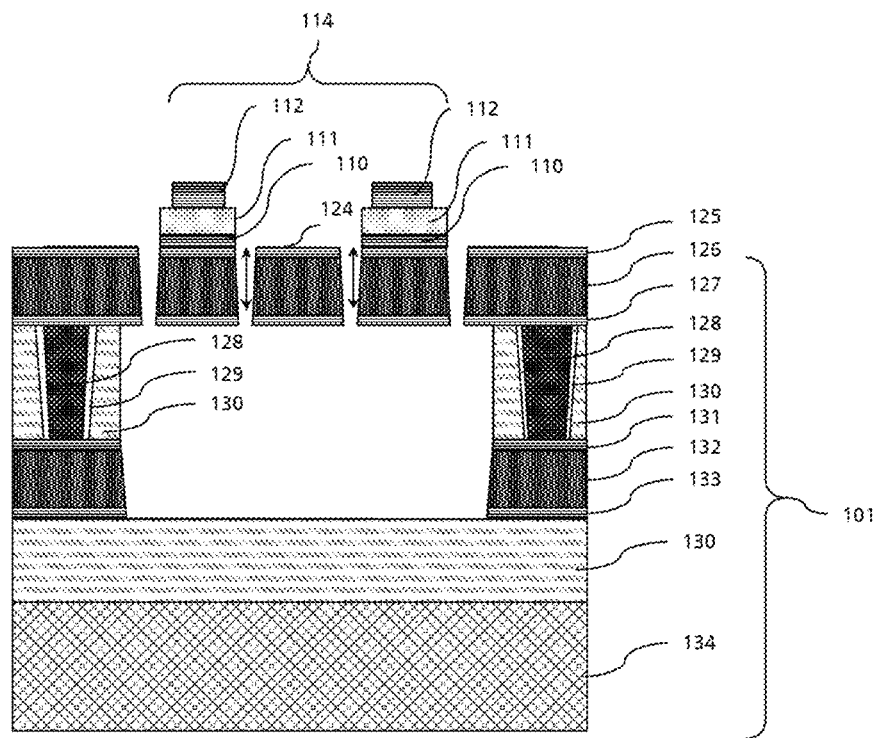
FIG. 14 a view corresponding to FIG. 11 of a piezoelectric element with electrode stacks arranged on multiple webs.

In FIG. 14, a view corresponding to FIG. 11 shows another embodiment of a piezoelectric element. In this figure, separate structuring of the ferroelectric capacitor stack 105, 106, 107 was performed prior to structuring of the metallization layer 125, 126, 127 acting as a diaphragm by the etching processes described earlier. In this embodiment of the piezoelectric element, separate movement of the web 114 or a beam is possible.

Figure 15:
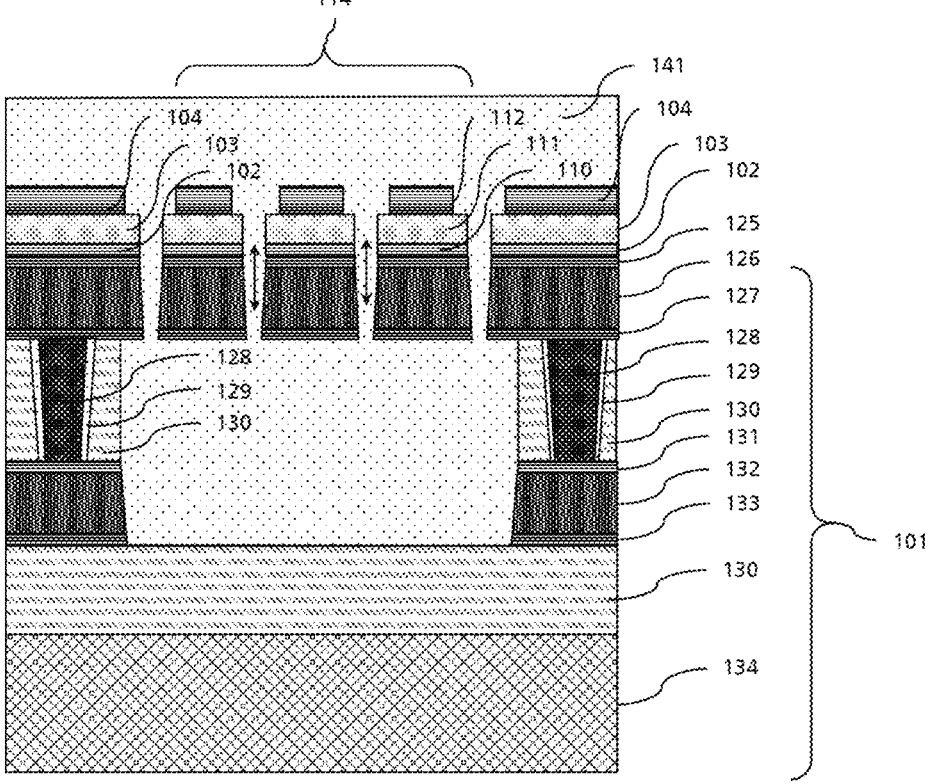
FIG. 15 a view corresponding to FIG. 14 of a piezoelectric element with a fluid-filled cavity.

In FIG. 15, a view corresponding to FIG. 14 shows another embodiment of a piezoelectric element. In the device shown in this embodiment, the component was filled with a liquid 141, preferably with low electrical conductivity, i.e., an electrical conductivity of less than 5 S/m. The introduction of the fluid 141 in the vibrating volume of the diaphragm is possible in all presented options of the piezoelectric component.

Figure 16:
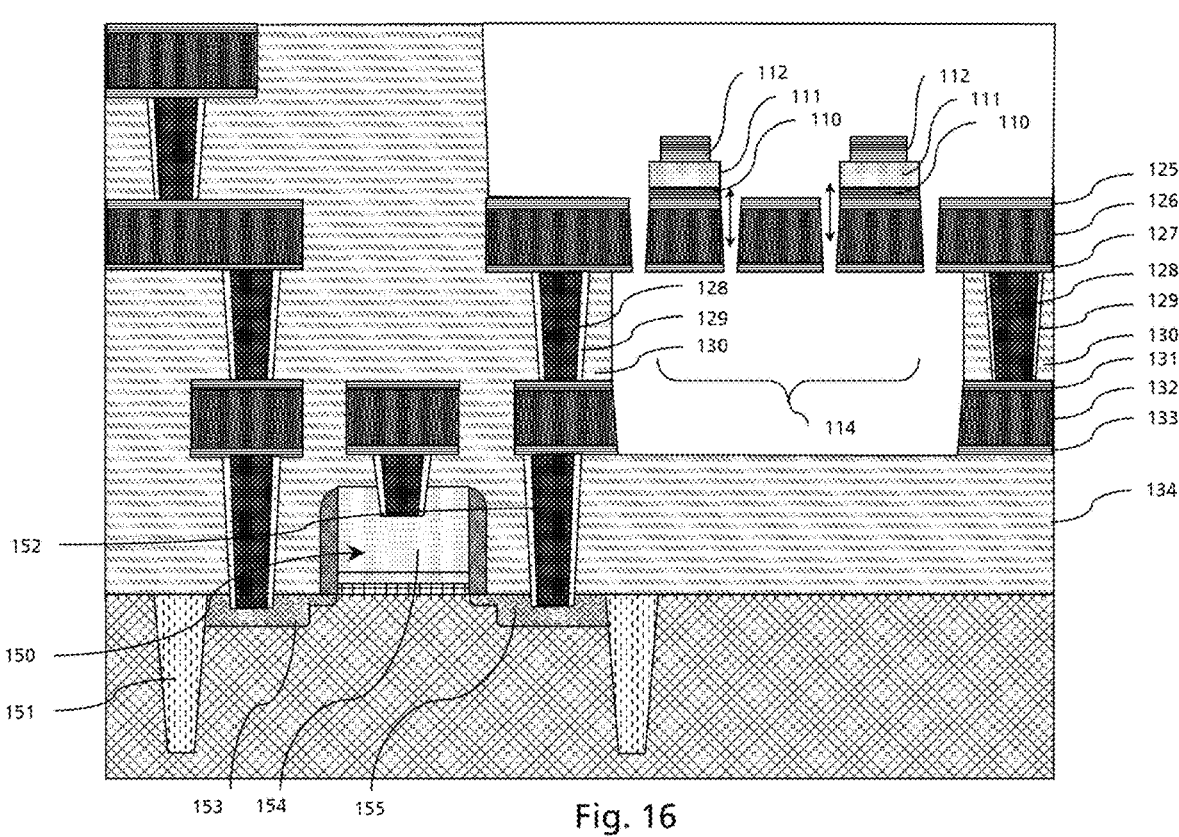
FIG. 16 a cross-section of another piezoelectric element corresponding to FIG. 13.

FIG. 16 shows a view corresponding to FIG. 13 of a further embodiment of a piezoelectric element, in which the piezoelectric element is introduced, for example, in the second metallization level, in the so-called "back-end-of-line" (BEoL). The insertion of this element is also possible in higher metallization levels. In addition, a piezo element analogous to FIGS. 11-15 is equally possible. By means of the via in the first metallization level 128 and the via in the second metallization level 152, typically each surrounded by a barrier layer, for example 129 in the case of via 128, and metallization layers 131, 132 and 133, the first electrode layer 110 of the ferroelectric capacitor formed by layers 110, 111 and 112 is connected to the drain contact 155 of a transistor 150. These can be different transistor types such as PolySiON Bulk, HKMG Bulk (High k metal gate), FDSOI (Fully depleted silicon on insulator) or FinFET (fin field effect transistor). By means of an electrical voltage at the gate contact 154, the transistor is opened and the supply voltage applied to the source contact of the transistor is applied to the ferroelectric capacitor. The switching of the transistor 150 can be modulated here by selecting the gate voltage at 154, for example, in an intermittent or oscillating manner. The electrical voltage applied to the ferroelectric capacitor leads to a mechanical tension of the diaphragm or the web 114 or beam. With a high-frequency change, for example in the range of 10 kHz-10 MHz, an ultrasonic wave can thus be generated. The transistor can be part of an oscillating circuit, for example.

Figure 17:
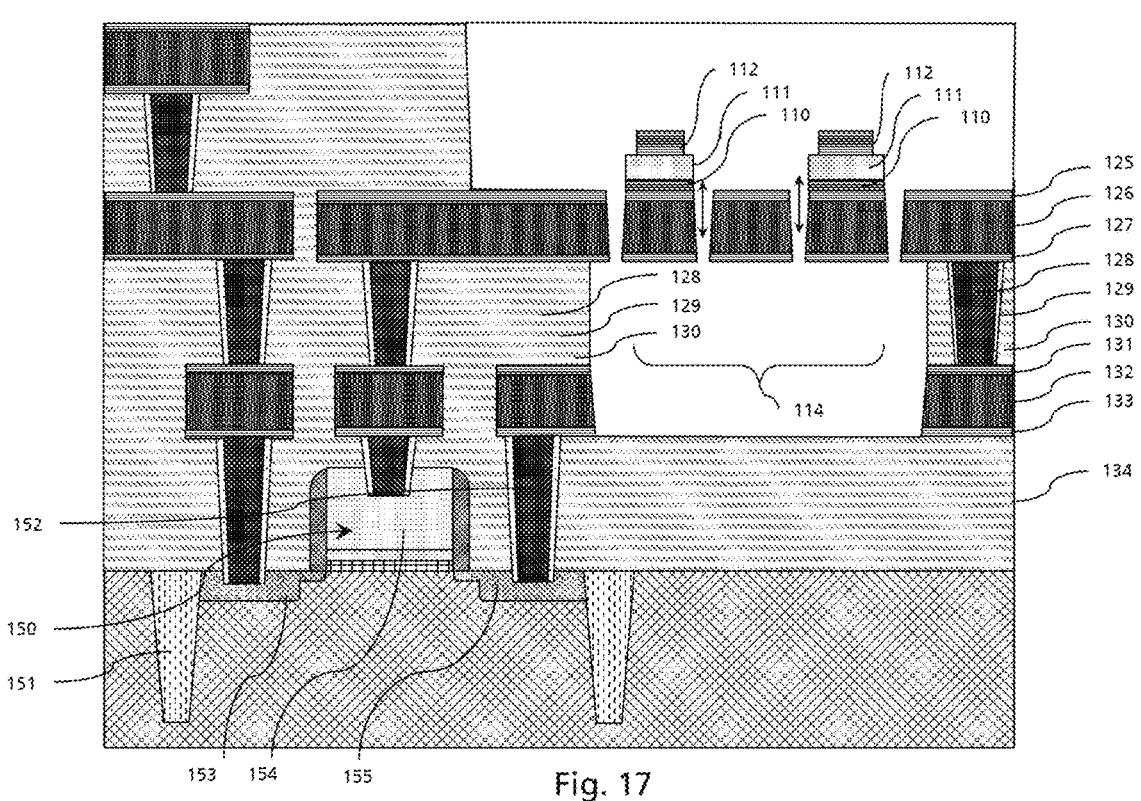
FIG. 17 a cross-section of another piezoelectric element with additional vias, corresponding to FIG. 13.

In the embodiment shown in FIG. 17 in a view corresponding to FIG. 13, the piezoelectric element is inserted, for example, in the second metallization level, in the BEoL. In this case, the lower electrode of the ferroelectric capacitor is connected to the gate contact of the transistor. Under mechanical shock, the piezo voltage generated across the capacitor formed by layers 110, 111 and 112 will be applied to the gate. The transistor is thus opened or closed depending on the mechanical movement of the diaphragm. Under a resonant movement of the diaphragm, a stable oscillating opening of the transistor is generated, this allows a phase stable oscillator as a clock of other circuits connected to this system.

Figures 18, 19, 20:
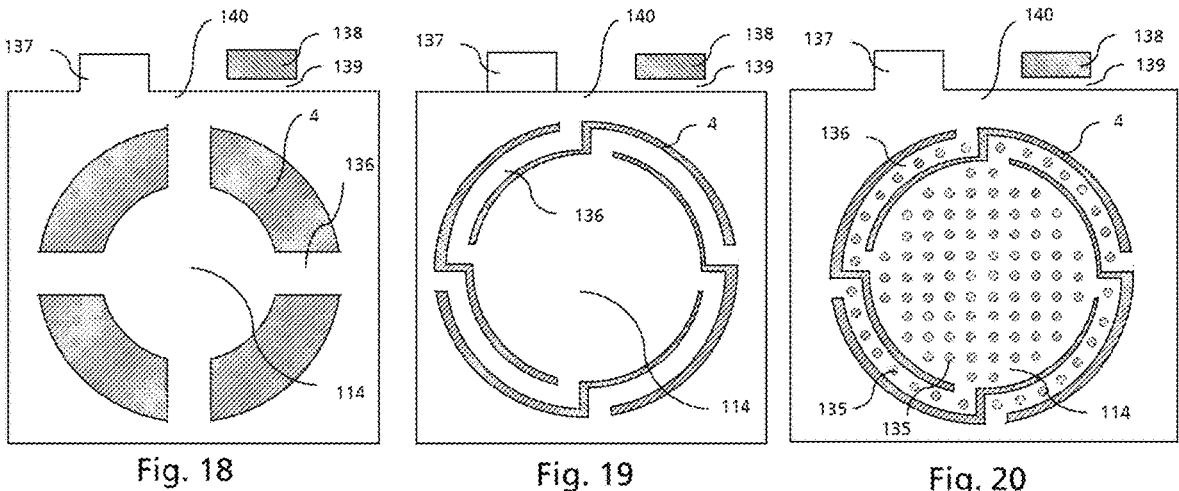
FIG. 18 a top view of a piezoelectric component.
FIG. 19 a top view corresponding to FIG. 18 of a piezoelectric component with elongated webs.
FIG. 20 a top view corresponding to FIG. 18 of a piezoelectric component with elongated webs and a perforated surface.

In FIG. 18, a top view of a piezoelectric component corresponding to the cross-sectional views in FIGS. 11-15 and its contacting is shown in a representation corresponding to FIGS. 4-7. In this case, the diaphragm 114 is tethered by four evenly spaced webs 136. The region 4 is exposed through etching. In this case, the pMUT 140 is contacted by means of an upper electrode led out to the first pad connection 137 and a lower electrode led out and insulated from the first electrode 137 by, for example, a gap 139 to pad connection 138. By means of a further contacting analogous to FIG. 4, the pMUT can be operated by means of a actuation system 113.

FIG. 19 shows a top view, again corresponding to FIG. 18, of a piezoelectric component corresponding to the cross-sectional representations in FIGS. 11-15 and their contacting. In this case, the diaphragm 114 is connected via a web 136 which is elongated compared to FIG. 18. The option shown in FIG. 19 represents one possibility, other possibilities include providing additional turns of the web 136. The region 4 is exposed through etching as in the exemplary embodiment shown in FIG. 18. Lengthening the web 136 increases the deflection of the diaphragm, this increases the deflection of the diaphragm 114 and therefore the amplitude of the emitted ultrasonic wave, but reduces the resonant frequency of the pMUT 140.

FIG. 20 shows a top view corresponding to FIG. 18 of a piezoelectric component corresponding to the cross-sectional representations in FIGS. 11-15 as well as their contacting. Referring to FIG. 13, the diaphragm 114 is now provided with additional perforation holes 135 arranged in a grid structure to ensure removal of the dielectric 130 for larger transducers. These perforation holes 135 may be positioned arbitrarily.

Figure 21:
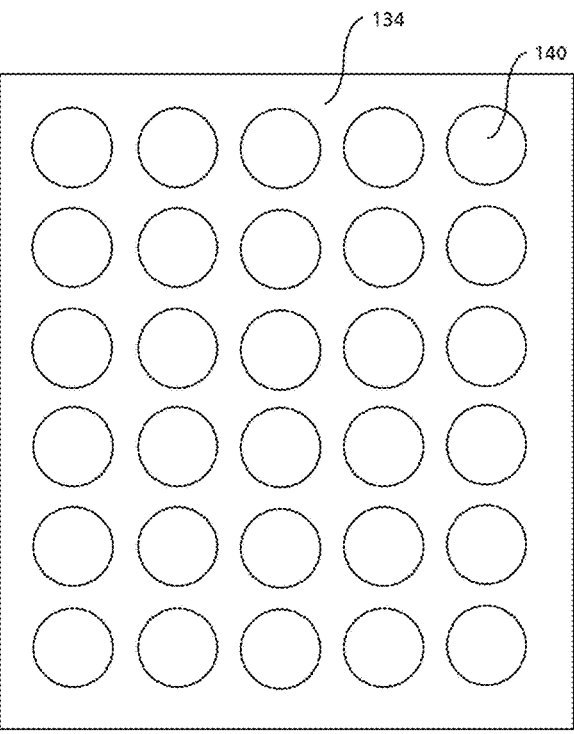
FIG. 21 a top view of an arrangement of multiple piezoelectric components.

FIG. 21 shows an arrangement of the piezoelectric component, in the illustrated embodiment pMUT 140 on the silicon wafer 134. This cubic arrangement allows high areal density, easy contacting. Alternatively, a hexagonal arrangement is possible.

Figure 22:
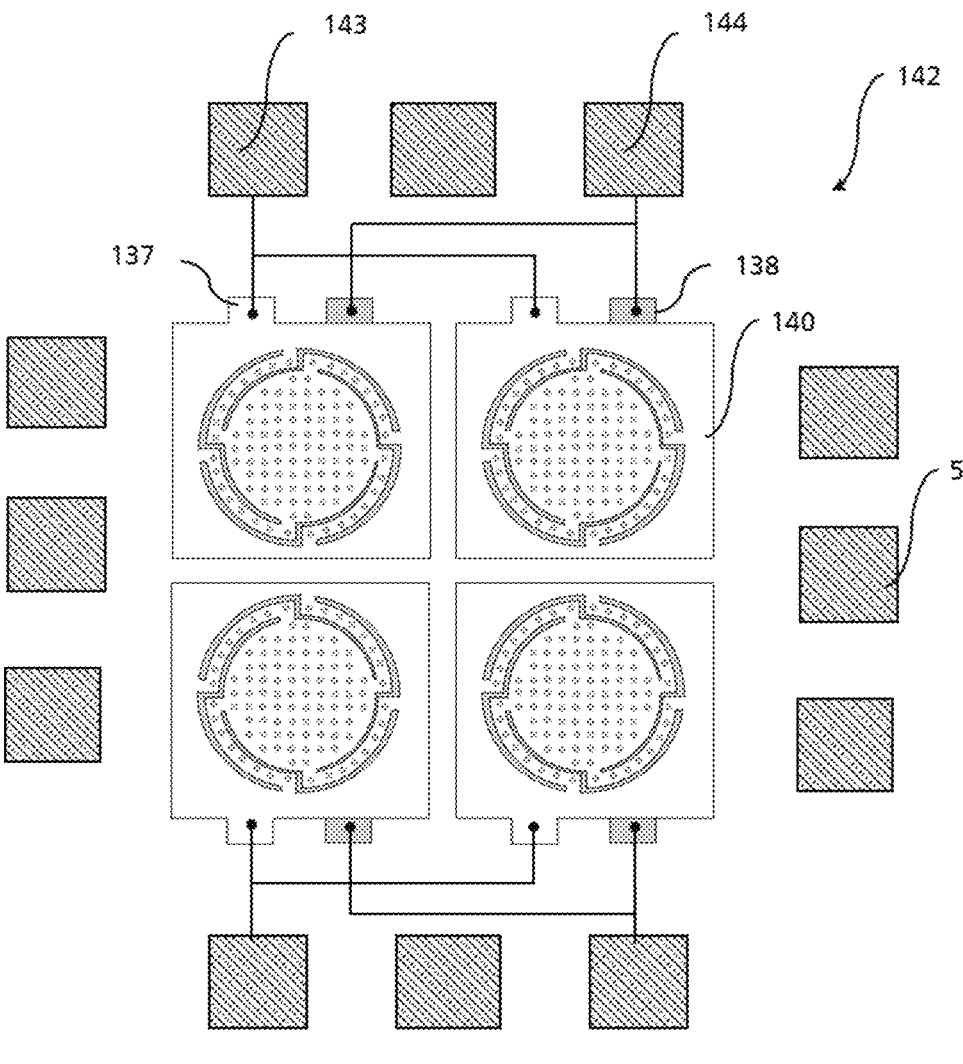
FIG. 22 a top view of an array of piezoelectric components and an electrical or electronic circuit.

FIG. 22 shows a possible contacting of an array of 2×2 piezoelectric components such as pMUT 140. These are surrounded by a row of electrode pads 5 and columns at the corners 142. The lower electrode contacts or first pad terminals 137 are now electrically contacted with a first pad 143, and the upper electrode contacts or second pad terminals 138 are electrically contacted with a second pad 144. The contacting of the pads 143 and 144 can now be implemented in systems using known means of integrated circuit packaging, e.g. by means of wire bonding wires in a printed circuit board.

An arrangement corresponding to FIG. 20 is shown in FIG. 23. In this embodiment, the upper electrode is removed on the upper diaphragm surface of diaphragm 124, analogously to FIG. 14. The webs 136 are contacted via, for example, four contacts 6, 137, 143, 144. This allows controlled three-dimensional tilting of the diaphragm 124, both statically and dynamically. This can be used to select the mechanical resonance of the unit from the diaphragm 124 and the webs 136 for the selection of the ultrasonic frequency.

FIG. 24 shows a schematic representation of the expected distortion of the diaphragm 124 and the webs 136 of a piezoelectric component 140 according to FIGS. 13-15 and FIG. 20 in perspective view. The diaphragm 124 is raised or lowered homogeneously in this case, depending on the drive voltage of a actuation circuit 113. In addition to a round implementation of the diaphragm 124, various shapes such as squares or rectangles are also possible.

FIG. 25 shows a schematic representation corresponding to FIG. 24 of the expected distortion of the diaphragm 124 and the webs 136 of a piezoelectric component 140 according to FIGS. 13-15 and FIG. 20. In contrast to previous embodiments, the embodiment reproduced in this figure includes a window 145 for optical or infrared radiation 145. In this context, optical radiation is electromagnetic radiation in the wavelength range between 400 nm and 780 nm, while infrared radiation is electromagnetic radiation in the wavelength range between 780 nm and 3 μm. In a Fabry-Pérot interferometer setup, the window 145 serves as a reference layer for a sensor located below it. By raising and lowering the window 145 contained in the diaphragm, the absorption wavelength in the sensor can be adjusted. Alternatively, a mirror surface can be realized. In the contacting of the e.g. four upper electrodes 6, 137, 143, 144 corresponding to FIG. 23, a tiltable mirror is thus obtained. In addition to a round implementation of the diaphragm 124, various other shapes are also possible, as before.

Figure 26:
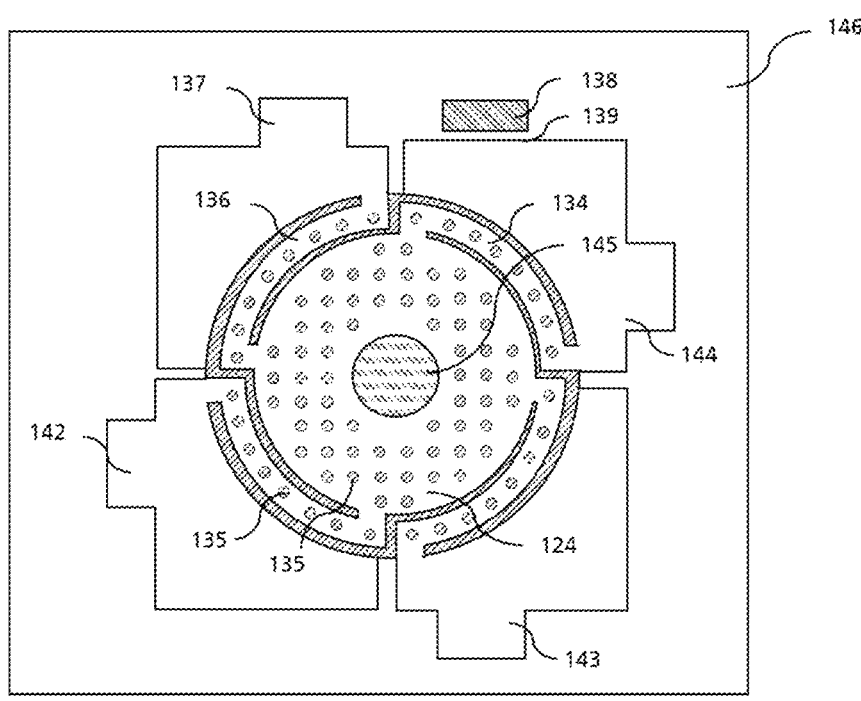
FIG. 26 a view corresponding to FIG. 23 with perforated diaphragm.

Again in plan view, FIG. 26 shows a representation corresponding to FIG. 23 of a piezoelectric component corresponding to the cross-sectional representations in FIGS. 11-15 as well as their contacting. Deviating from FIG. 23, the mirror or window element 145 already discussed in FIG. 25 is now implemented. A tiltable mirror or optical sensor is obtained by contacting the four upper electrodes 6, 137, 143, 144, for example.

Figure 27:
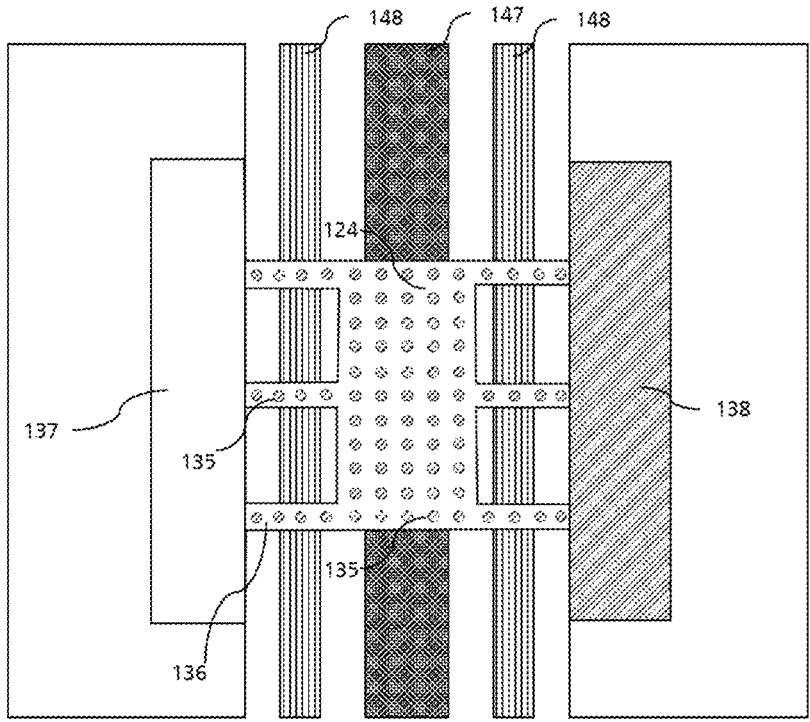
FIG. 27 a top view of a piezoelectric element with high-frequency waveguide arranged underneath.

FIG. 27 shows a top view of a piezoelectric component corresponding to the cross-sectional views in FIGS. 11-15 and its contacting. In contrast to FIG. 23, the diaphragm 124 has a rectangular base and protruding webs 136. Similarly, the diaphragm is caused to rise and fall by means of an electrical voltage at the contact of the upper electrodes 137 and 138. A high-frequency waveguide is implemented below or above the diaphragm, which in the illustrated embodiment comprises a central ground line 147 and signal lines 148 arranged on both sides thereof. Other planar high-frequency waveguides are possible here. By adjusting the impedance, low as well as high transmission can thus be achieved for certain frequencies.

Figure 28:
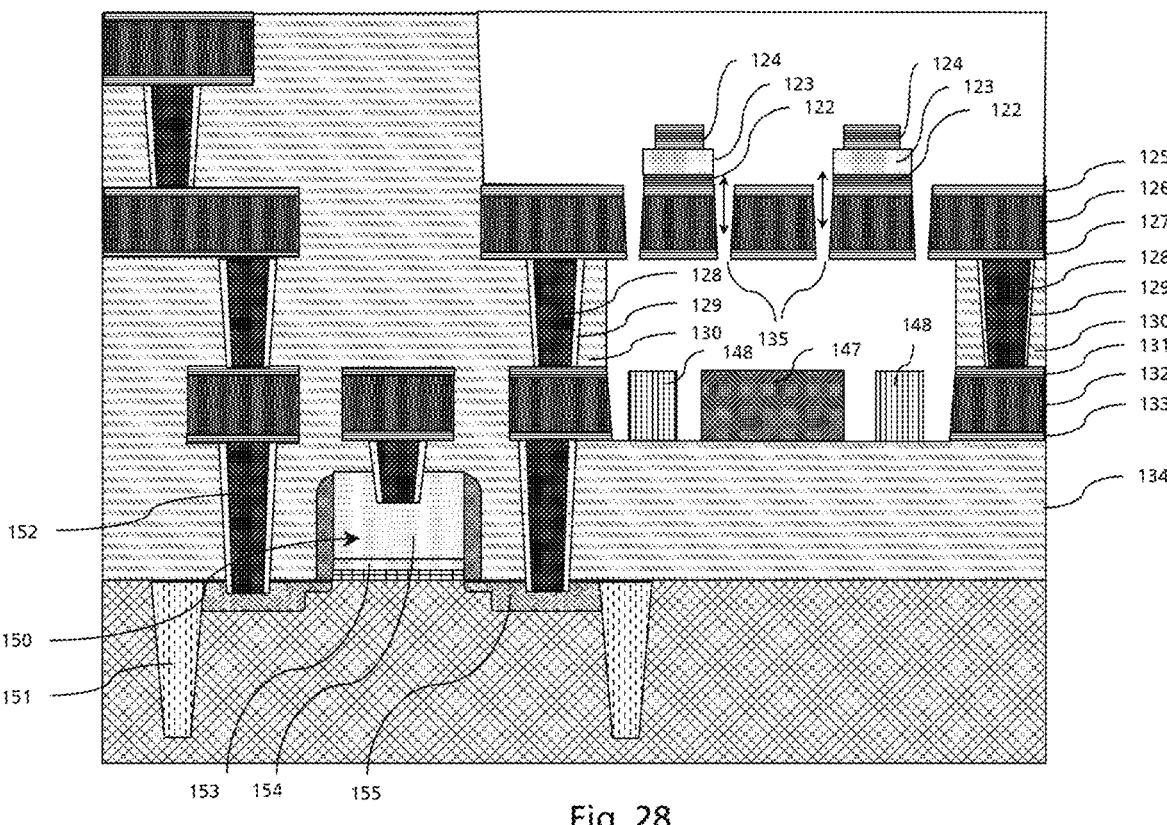
FIG. 28 a view corresponding to FIG. 16 of a piezoelectric element inserted into a second metallization plane, and FIG. 29 a view of the piezoelectric element rotated 180° from the view in FIG. 28.

FIG. 28 shows a view corresponding to FIG. 16 of a further embodiment of a piezoelectric element, in which the piezoelectric element is inserted, for example, in the second metallization level, in the so-called "back-end-of-line" (BEoL). Analogous to FIG. 27, a high-frequency waveguide is introduced here in an exemplary manner of a ground 147-signal 148-ground 147 arrangement. This may be implemented in the manufacturing process as part of the metallization levels 131, 132, 133. Suitable materials for the high-frequency waveguide are aluminum, copper, ruthenium, cobalt and alloys thereof. For ultrahigh-frequency systems, this layer can therefore be much thicker, e.g. thicker than 1 μm, than in typical BEoL realizations. In addition, the via layer 128, 129, 130 may be thinner than in typical realizations, e.g., below 500 nm.

Figure 29:
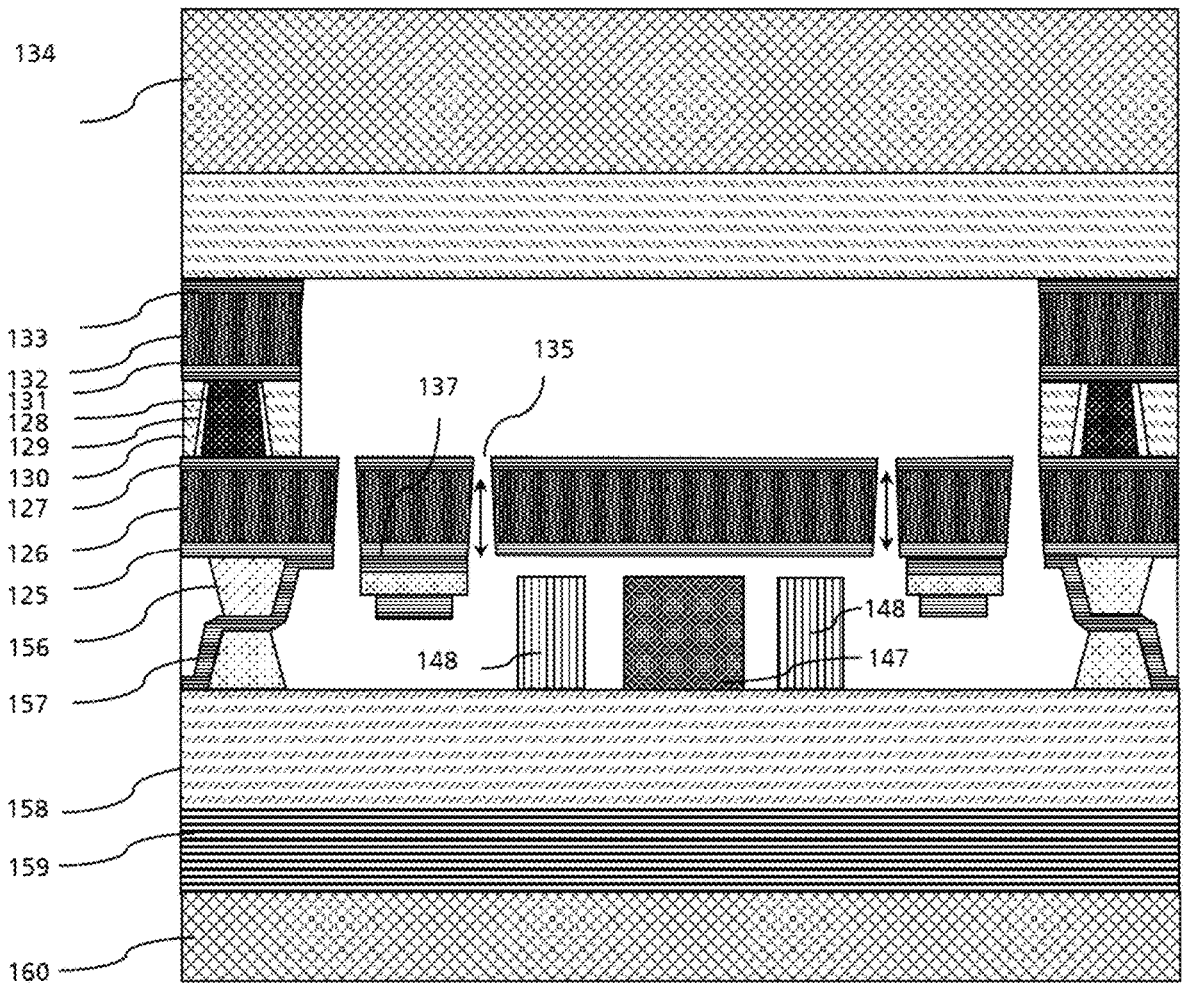

FIG. 29 shows another embodiment of a piezoelectric element in a view corresponding to FIG. 28, but rotated by 180° relative to the representation in FIG. 28, in which the piezoelectric element or the piezoelectric element is introduced, for example, in the second metallization plane, in the so-called "back-end-of-line" (BEoL). This piezoelectric element is now applied to another carrier wafer 160 with integrated circuits, e.g. ASICs (application-specific integrated circuit) 159, already applied and an intermediate dielectric 158 in a wafer bonding process. Here, the contacting of the first pad connection 137 is realized by means of a feedthrough 157 of a stand structure 156 and connected by means of a via into the region of the integrated circuits or ASICs 159. This allows the piezoelectric component to be controlled, for example by means of an internal circuit. In this regard, an exemplary implementation for the application of an RF switch is the integration of a radio frequency waveguide in an exemplary manner of a ground 147-signal 148-ground 147 arrangement. In addition, it is possible that the carrier wafer 160 is structured up to the intermediate dielectric layer 158 such that an ultrasonic wave can be emitted. The emission strength as well as the frequency can be modulated using internal circuits 159. In this case, the insertion of the high-frequency waveguide would be omitted.

As mentioned above, the ferroelectric layer 103 or 111 as a thin film ferroelectric is CMOS compatible and often implemented as a gate dielectric in common CMOS processes. The described piezoelectric elements can therefore be produced in a CMOS process line, which allows lower production costs and a higher throughput than with conventional methods. The small thickness of the voltage-varying ferroelectric capacitor thus formed enables high scalability for very highly miniaturized systems. This allows for a very small thickness of the carrier material, the second semiconductor layer 101b in substrate 101 as well as metallization layers 125, 126 and 127 or 135, 136 and 137. In this context, the "silicon-on-insulator" approach used according to FIGS. 1, 8 and 11 enables the piezoelectric component to be realized at thicknesses of the second semiconductor layer 101b of the substrate 101 of 50 nm to 1 μm or of the metallization layers 125, 126 and 127 or 135, 136 and 137 of 50 nm to 1 μm. Since the piezoelectric element is lead-free, the component is also RHoS compatible.

To increase a breakdown strength, it is also possible to use ultralaminates. They are oxide layer of, for example, $Al_2O_3$, $SiO_2$, or $ZrO_2$ having a layer thickness of a maximum of 3 nm. These are introduced alternating with the hafnium oxide with individual layer thicknesses of 3 nm to 20 nm. In addition to a breakdown voltage, a switching voltage is thus also increased and raised by a factor of at least 5. An alternating series control of the ferroelectric capacitors can additionally be carried out for high voltage applications.

Suitable materials for the ferroelectric layers 103 and 111 include hafnium oxide doped or undoped with silicon, aluminum, germanium, magnesium, calcium, strontium, barium, titanium, zirconium and rare earth elements, as well as other compliant ferroelectrics that can be deposited. Due to the CMOS compatibility of the hafnium oxide and the above-mentioned dopants, it is also possible to manufacture other electronics on the same substrate ("on-chip"). The described component can be manufactured as a single miniaturized SMD device. This allows for even the smallest chip sizes such as the 01005 format.

Due to the good structurability of the thin film piezoelectric, an effective area increase can be achieved, which results in a significant increase in fingerprint resolution as well as ultrasonic sensors in an array. Due to CMOS compatibility, the sensor can also be integrated into the BEoL. This allows the control logic to be stacked underneath. Application fields of this ultrasonic transducer are in the field of medical applications as well as security systems or fingerprint scanners.

The described piezoelectric element can also be used to realize a sensor arrangement in which several piezoelectric elements are arranged as an array. A back contact, i.e., the first electrode layer 102 or 110 of each sensor is connected to a common bitline, while a front contact, i.e., the second electrode layer 104 or 112, can be contacted through to the last metallization level within the CMOS process flow by contact pads.

Only features of the different embodiments disclosed in the embodiments can be combined with one another and claimed individually.

LIST OF REFERENCE NUMERALS

101a first semiconductor layer
101b second semiconductor layer
4 region exposed through etching
6 electrode pad
100 intermediate layer
101 substrate
102 first electrode layer
103 ferroelectric, piezoelectric and/or flexoelectric layer
104 second electrode layer
108 recess
110 first electrode layer
111 ferroelectric, piezoelectric and/or flexoelectric layer
112 second electrode layer
113 actuation system
114 web
124 diaphragm
125 metallization layer
126 metallization layer
127 metallization layer
128 via
129 barrier layer
130 intermediate layer
131 metallization layer
132 metallization layer
133 metallization layer
134 silicon wafer
135 perforation hole
136 web
137 first pad connection
138 second pad connection
139 gap
140 pMUT
141 liquid
142 corner
143 first pad
144 second pad
145 window
147 ground line
148 signal line
150 transistor
151 second metallization level
154 gate contact
155 drain contact
156 stand structure
157 feedthrough
158 intermediate layer dielectric
159 ASIC
160 carrier wafer

14

The invention claimed is:

1. A piezoelectric element, comprising:
a substrate in which an intermediate layer is arranged between a first substrate layer and a second substrate layer,
a first electrode layer of an electrically conductive, non-ferroelectric material disposed on the second substrate layer of the substrate,
a ferroelectric, piezoelectric and/or flexoelectric layer arranged on the first electrode layer, and
a second electrode layer of an electrically conductive, non-ferroelectric material arranged on the ferroelectric, piezoelectric and/or flexoelectric layer, wherein
the intermediate layer and/or the first substrate layer of the substrate is removed below a layer stack formed by the first electrode layer, the ferroelectric, piezoelectric and/or flexoelectric layer and the second electrode layer, so that the layer stack can be moved in a translatory manner along its normal directed along the layer stack, and wherein
the ferroelectric, piezoelectric and/or flexoelectric layer comprises undoped or doped hafnium oxide.

2. The piezoelectric element according to claim 1, wherein the intermediate layer is formed of an electrically insulating material or as a dielectric.

3. The piezoelectric element according to claim 1, wherein the second substrate layer has a smaller layer thickness than the first substrate layer.

4. The piezoelectric element according to claim 1, wherein the ferroelectric, piezoelectric and/or flexoelectric layer has a layer thickness of at most 500 nm.

5. The piezoelectric element according to claim 1, wherein the intermediate layer is removed below a ridge formed from the second substrate layer such that the ridge can be moved in a translatory manner parallel to the layer stack.

6. The piezoelectric element according to claim 1, wherein the doped hafnium oxide is preferably doped with silicon, aluminum, germanium, magnesium, calcium, strontium, barium, titanium, zirconium and/or a rare earth element.

7. The piezoelectric element according to claim 1, wherein the ferroelectric, piezoelectric and/or flexoelectric layer comprises at least one ultra-laminate of a layer of hafnium oxide and a layer of another oxide.

8. An ultrasonic transducer, spectrometer, radio frequency switch, or fingerprint sensor comprising a piezoelectric element according to claim 1.

9. A method of manufacturing a piezoelectric element in which, on a substrate in which an intermediate layer is disposed between a first substrate layer and a second substrate layer,
on the second substrate layer of the substrate, a first electrode layer made of an electrically conductive, non-ferroelectric material,
on the first electrode layer a ferroelectric, piezoelectric and/or flexoelectric layer and
on the ferroelectric, piezoelectric or flexoelectric layer, a second electrode layer of an electrically conductive non-ferroelectric material is applied, wherein
the intermediate layer and/or the first substrate layer is removed below a layer stack formed by the first electrode layer, the ferroelectric, piezoelectric or flexoelectric layer and the second electrode layer so that the layer stack can be moved in a translatory manner along its normal directed along the layer stack, and wherein the ferroelectric, piezoelectric and/or flexoelectric layer comprises undoped or doped hafnium oxide.

10. The method according to claim 9, wherein the second substrate layer is perforated before removing the intermediate layer and/or the first substrate layer.

* * * * *